United States Patent
Wen et al.

(10) Patent No.: US 9,000,525 B2
(45) Date of Patent: Apr. 7, 2015

(54) STRUCTURE AND METHOD FOR ALIGNMENT MARKS

(75) Inventors: Ming-Chang Wen, Kaohsiung (TW); Hsien-Cheng Wang, Hsinchu (TW); Chun-Kuang Chen, Hsin-Chu Hsien (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 690 days.

(21) Appl. No.: 12/783,200

(22) Filed: May 19, 2010

(65) Prior Publication Data

US 2011/0284966 A1 Nov. 24, 2011

(51) Int. Cl.
*H01L 21/70* (2006.01)
*H01L 21/8234* (2006.01)
*H01L 29/66* (2006.01)

(52) U.S. Cl.
CPC *H01L 21/823456* (2013.01); *H01L 21/823493* (2013.01); *H01L 29/6659* (2013.01); *H01L 29/66545* (2013.01)

(58) Field of Classification Search
USPC .................... 257/368, E27.06, E21.437, 797; 438/289, 305
See application file for complete search history.

(56) References Cited

U.S. PATENT DOCUMENTS

| | | | | |
|---|---|---|---|---|
| 4,139,402 A * | 2/1979 | Steinmaier et al. | ........... | 438/232 |
| 5,240,865 A * | 8/1993 | Malhi | ........... | 438/135 |
| 5,547,888 A * | 8/1996 | Yamazaki | ........... | 438/279 |
| 5,580,804 A * | 12/1996 | Joh | ........... | 438/231 |
| 5,761,127 A * | 6/1998 | Akaogi et al. | ........... | 365/185.27 |
| 5,889,335 A * | 3/1999 | Kuroi et al. | ........... | 257/797 |
| 6,117,723 A * | 9/2000 | Huang | ........... | 438/238 |
| 6,153,455 A * | 11/2000 | Ling et al. | ........... | 438/231 |
| 6,215,197 B1 * | 4/2001 | Iwamatsu | ........... | 257/797 |
| 6,218,262 B1 * | 4/2001 | Kuroi et al. | ........... | 438/401 |
| 6,303,418 B1 * | 10/2001 | Cha et al. | ........... | 438/199 |
| 6,316,302 B1 * | 11/2001 | Cheek et al. | ........... | 438/199 |
| 6,521,487 B1 * | 2/2003 | Chen et al. | ........... | 438/133 |
| 6,541,357 B1 * | 4/2003 | Inaba | ........... | 438/482 |
| 6,544,827 B2 * | 4/2003 | Abiko | ........... | 438/183 |
| 6,605,493 B1 * | 8/2003 | Yu | ........... | 438/135 |
| 6,656,815 B2 * | 12/2003 | Coolbaugh et al. | ........... | 438/401 |
| 6,673,635 B1 * | 1/2004 | Hellig et al. | ........... | 438/7 |
| 6,680,231 B1 * | 1/2004 | Yang et al. | ........... | 438/268 |
| 6,908,801 B2 * | 6/2005 | Saito | ........... | 438/199 |
| 6,939,777 B2 * | 9/2005 | Ohto et al. | ........... | 438/401 |
| 6,987,322 B2 * | 1/2006 | Chen et al. | ........... | 257/758 |
| 7,005,755 B2 * | 2/2006 | Yoshimura et al. | ........... | 257/797 |
| 7,064,044 B2 * | 6/2006 | Chen et al. | ........... | 438/401 |

(Continued)

OTHER PUBLICATIONS

Terasa, R., et al., "Alternative phosphorus-doped amorphous silicon using trimethylphosphine diluted in hydrogen," PII: S0040-6090(02)01207-5, Elsevier Science B.V., 2002, p. 270-273.

(Continued)

*Primary Examiner* — Mohammad Islam
*Assistant Examiner* — Ankush Singal
(74) *Attorney, Agent, or Firm* — Haynes and Boone, LLP

(57) ABSTRACT

The alignment mark and method for making the same are described. In one embodiment, a semiconductor structure includes a plurality of gate stacks formed on the semiconductor substrate and configured as an alignment mark; doped features formed in the semiconductor substrate and disposed on sides of each of the plurality of gate stacks; and channel regions underlying the plurality of gate stacks and free of channel dopant.

20 Claims, 11 Drawing Sheets

(56) References Cited

U.S. PATENT DOCUMENTS

| | | | |
|---|---|---|---|
| 7,084,022 B2 * | 8/2006 | Saito | 438/183 |
| 7,098,522 B2 * | 8/2006 | Lin et al. | 257/500 |
| 7,238,592 B2 * | 7/2007 | Doumae | 438/462 |
| 7,265,050 B2 * | 9/2007 | Choi et al. | 438/672 |
| 7,332,405 B2 * | 2/2008 | Yabe et al. | 438/401 |
| 7,338,885 B2 * | 3/2008 | Oh et al. | 438/462 |
| 7,419,882 B2 * | 9/2008 | Wu et al. | 438/386 |
| 7,534,695 B2 * | 5/2009 | Suzuki et al. | 438/401 |
| 7,611,961 B2 * | 11/2009 | Yang | 438/401 |
| 7,718,475 B2 * | 5/2010 | Goldbach et al. | 438/142 |
| 7,915,111 B2 * | 3/2011 | Yang et al. | 438/199 |
| 7,943,468 B2 * | 5/2011 | Curello et al. | 438/289 |
| 7,994,591 B2 * | 8/2011 | Shin | 257/411 |
| 8,008,788 B2 * | 8/2011 | Koketsu et al. | 257/797 |
| 8,084,824 B2 * | 12/2011 | Yu et al. | 257/369 |
| 8,129,234 B2 * | 3/2012 | Wallner et al. | 438/204 |
| 8,143,075 B2 * | 3/2012 | Maruyama | 438/7 |
| 8,148,232 B2 * | 4/2012 | Chen et al. | 438/401 |
| 8,237,209 B2 * | 8/2012 | Chang et al. | 257/307 |
| 8,334,198 B2 * | 12/2012 | Chen et al. | 438/595 |
| 2002/0030290 A1 * | 3/2002 | Hirase et al. | 257/797 |
| 2002/0063267 A1 * | 5/2002 | Kumagai et al. | 257/202 |
| 2002/0182821 A1 * | 12/2002 | Yabe et al. | 438/401 |
| 2002/0197812 A1 * | 12/2002 | Fan | 438/369 |
| 2003/0213971 A1 * | 11/2003 | Yu | 257/119 |
| 2004/0135226 A1 * | 7/2004 | Yoshimura et al. | 257/499 |
| 2005/0101107 A1 * | 5/2005 | Ohto et al. | 438/462 |
| 2005/0104229 A1 * | 5/2005 | Kim et al. | 257/797 |
| 2005/0277287 A1 * | 12/2005 | Chen et al. | 438/637 |
| 2006/0060904 A1 * | 3/2006 | Hong | 257/298 |
| 2006/0103035 A1 * | 5/2006 | Maruyama | 257/797 |
| 2007/0018341 A1 * | 1/2007 | Hsieh et al. | 257/797 |
| 2007/0032015 A1 * | 2/2007 | Itoh et al. | 438/250 |
| 2007/0063276 A1 * | 3/2007 | Beintner et al. | 257/347 |
| 2007/0090548 A1 * | 4/2007 | Chia et al. | 257/797 |
| 2007/0222089 A1 * | 9/2007 | Maruyama | 257/797 |
| 2007/0293025 A1 * | 12/2007 | Adkisson et al. | 438/510 |
| 2008/0038864 A1 * | 2/2008 | Yoo et al. | 438/70 |
| 2008/0054374 A1 * | 3/2008 | Mikasa | 257/401 |
| 2008/0121915 A1 * | 5/2008 | Horii | 257/98 |
| 2008/0213936 A1 * | 9/2008 | Hatai | 438/60 |
| 2008/0299717 A1 * | 12/2008 | Winstead et al. | 438/197 |
| 2008/0303968 A1 * | 12/2008 | Terada et al. | 349/46 |
| 2009/0140354 A1 * | 6/2009 | Shin | 257/411 |
| 2009/0166749 A1 * | 7/2009 | Ichihara et al. | 257/369 |
| 2009/0191679 A1 * | 7/2009 | Ouyang et al. | 438/276 |
| 2009/0206411 A1 * | 8/2009 | Koketsu et al. | 257/368 |
| 2009/0242997 A1 * | 10/2009 | Yu et al. | 257/379 |
| 2009/0272976 A1 * | 11/2009 | Brunco et al. | 257/57 |
| 2009/0275179 A1 * | 11/2009 | Basker et al. | 438/231 |
| 2009/0302364 A1 * | 12/2009 | Duarte de Martin et al. | 257/296 |
| 2010/0068875 A1 * | 3/2010 | Yeh et al. | 438/587 |
| 2010/0073671 A1 * | 3/2010 | Chou et al. | 356/237.4 |
| 2010/0078695 A1 * | 4/2010 | Law et al. | 257/296 |
| 2010/0084715 A1 * | 4/2010 | Shen et al. | 257/390 |
| 2010/0244147 A1 * | 9/2010 | Yang et al. | 257/408 |
| 2010/0330728 A1 * | 12/2010 | McCarten et al. | 438/70 |
| 2011/0057266 A1 * | 3/2011 | Wallner et al. | 257/378 |
| 2011/0057267 A1 * | 3/2011 | Chuang et al. | 257/380 |
| 2011/0147853 A1 * | 6/2011 | Lin et al. | 257/379 |
| 2011/0272765 A1 * | 11/2011 | Seo et al. | 257/410 |
| 2012/0146159 A1 * | 6/2012 | Wang et al. | 257/410 |

OTHER PUBLICATIONS

Noguchi, Takashi, "Effective Dopant Activation in Silicon Film Using Excimer Laser Annealing for High-Performance Thin Film Transistors," Electrical and Electronics Engineering, University of the Ryukyus, Nishihara, Okinawa 903-0213, Japan, published online Mar. 21, 2008, p. 1858-1861.

* cited by examiner

STRUCTURE AND METHOD FOR ALIGNMENT MARKS

TECHNICAL FIELD

The present disclosure relates generally to alignment marks for lithographic processes and, more particularly, to a structure and method for an improved alignment mark for high-k metal gate processes.

BACKGROUND

Alignment marks are important in fabrication of semiconductor, or integrated circuit ("IC"), devices because the devices are produced by aligning several layers of conductive, semiconductive, and insulative materials one atop the other with reference to the alignment marks. It is critical that each layer is precisely aligned with the previous layer so that the resultant circuits are functional and reliable. Typically, aligning a layer with a previous one is accomplished using a wafer stepper, which is used to optically project a circuit pattern on a mask mounted therein onto a layer of the wafer disposed on a wafer chuck of the stepper. Before the mask pattern is transferred, the wafer must first be precisely aligned with the mask. Once such alignment is achieved, the remaining steps of projecting the mask pattern on to the semiconductor may be performed.

During the alignment phase, the position of the alignment mark on the wafer is typically sensed using a laser beam, which is bounced off the alignment mark to produce a reflective light signal. This reflective light is reflected back to an inspector of the stepper. The stepper analyzes the reflected light to determine the exact position of the alignment mark. Notably, the quality of the signal reflected from the alignment mark is directly dependent on the reliability and integrity of the structure thereof. Alignment marks fabricated using existing technologies do not lead to a strong reflected signal, which makes accurate alignment more difficult.

Therefore, while existing methods of forming alignment marks have been generally adequate for their intended purposes, they have not been entirely satisfactory in every aspect.

SUMMARY

The alignment mark and method for making the same are described. In one embodiment, a semiconductor structure includes a plurality of gate stacks formed on the semiconductor substrate and configured as an alignment mark; doped features formed in the semiconductor substrate and disposed on sides of each of the plurality of gate stacks; and channel regions underlying the plurality of gate stacks and free of channel dopant.

In another embodiment, a semiconductor structure includes a semiconductor substrate having a device region and an alignment region; a field-effect device formed within the device region; and an alignment mark formed within the alignment region. The field-effect device includes a first gate stack formed on the semiconductor substrate; a first source and drain regions formed in the semiconductor substrate and disposed on both sides of the first gate stack; and a first channel region having a channel doped feature formed in the semiconductor substrate and underlying the gate stack. The alignment mark includes a second gate stack formed on the semiconductor substrate; a second source and drain regions formed in the semiconductor substrate and disposed on both sides of the second gate stack; and a second channel region free of channel doped feature in the semiconductor substrate and underlying the second gate stack.

The present disclosure also provides a method including providing a semiconductor substrate having a device region and an alignment region; performing a first ion implantation to the semiconductor substrate within the device region while the alignment region is covered by an implantation mask layer; thereafter forming a first polysilicon gate stack in a device region and a second polysilicon gate stack in an alignment region; and thereafter performing a second ion implantation to the semiconductor substrate within the device region and within the alignment region.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
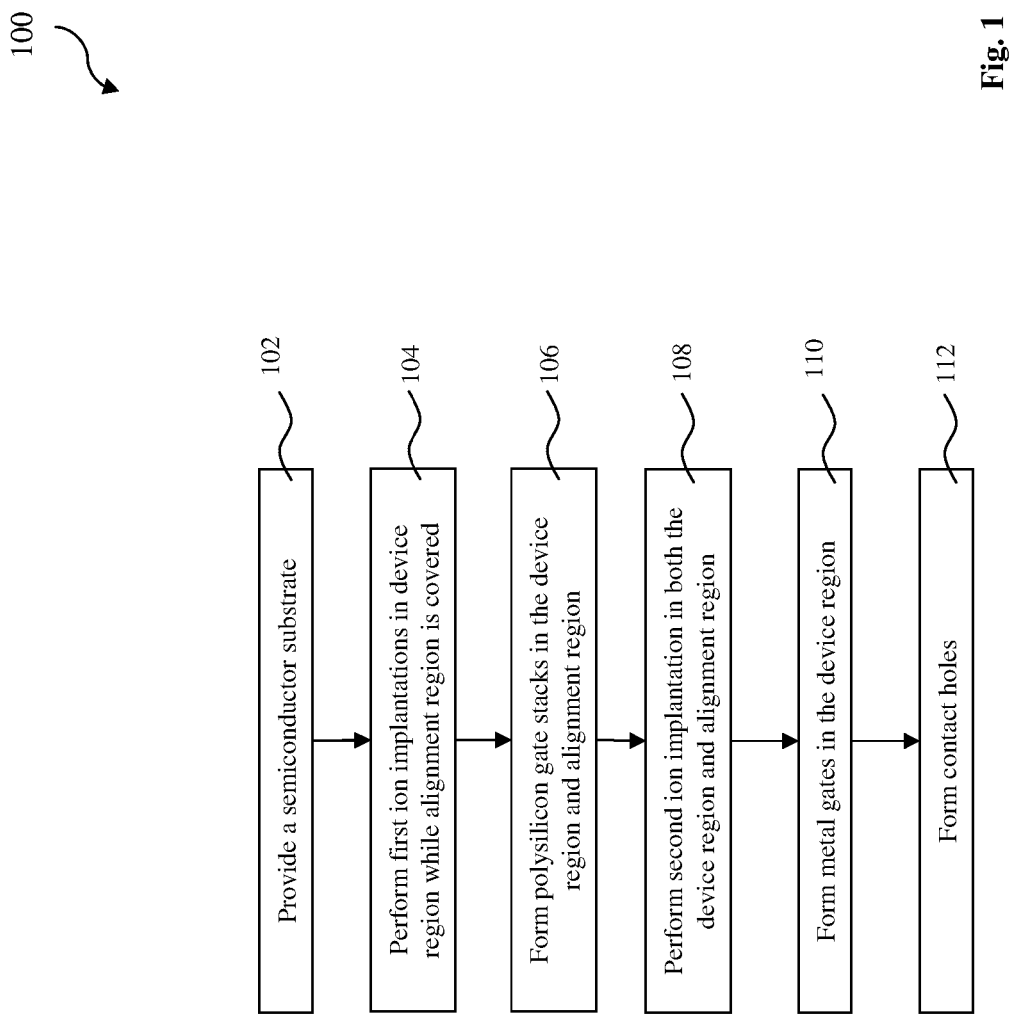
FIG. 1 is a flowchart of a method for making a semiconductor structure having an alignment mark constructed according to various aspects of the present disclosure.

The present disclosure relates generally to alignment marks for lithographic processes and, more particularly, to a structure and method for an improved alignment mark for high-k metal gate lithography processes. It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1 is a flowchart of a method 100 for making a semiconductor device according to one embodiment. The semiconductor device includes a metal gate stack and an alignment mark constructed according to various aspects of the present disclosure. FIGS. 2 through 10 are sectional views of a semiconductor structure 200 at various fabrication stages and constructed according to various embodiments. The semiconductor structure 200 and the method 100 of making the same are collectively described with reference to FIGS. 1 through 10.

Figure 2:
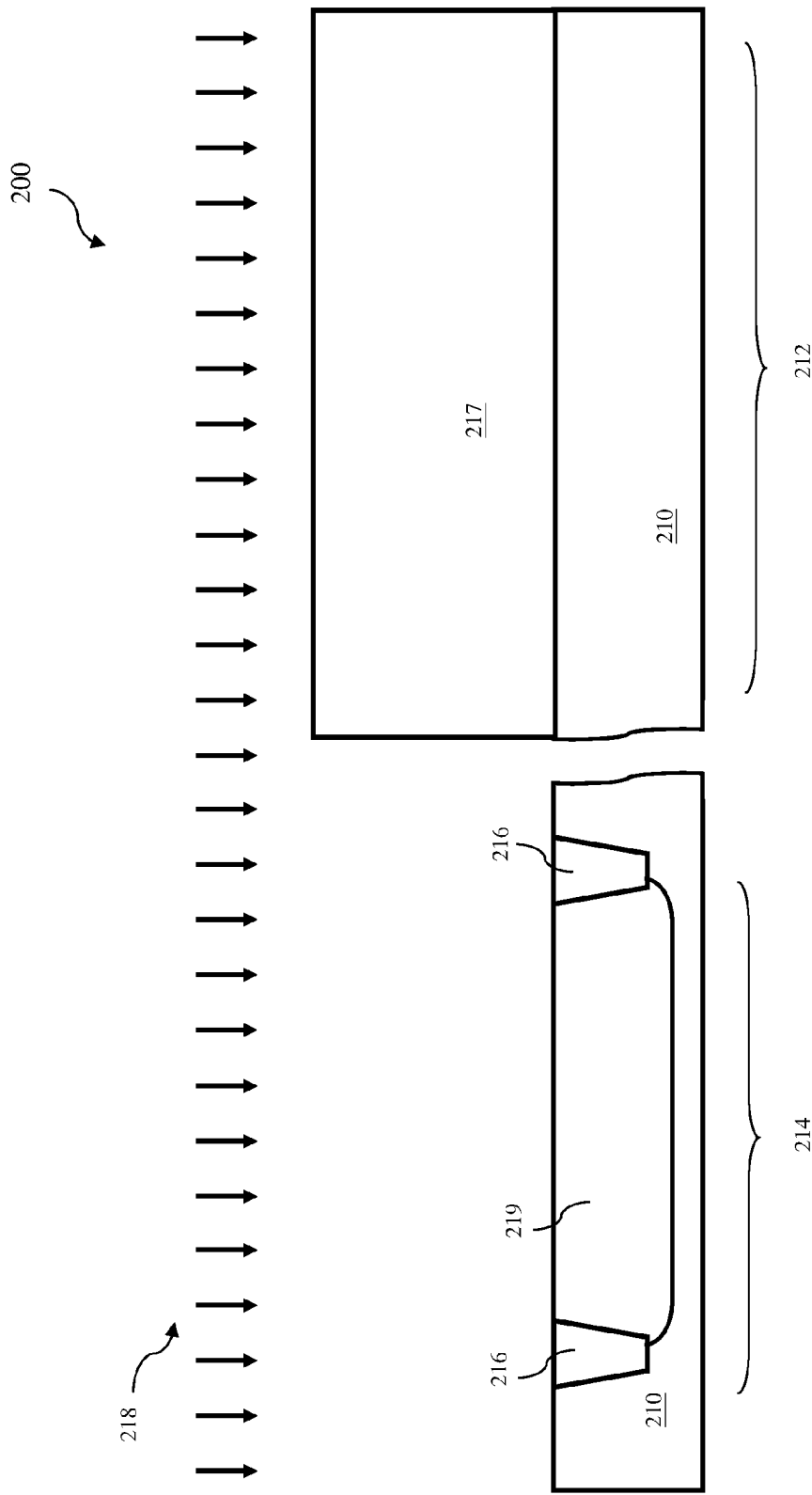
FIGS. 2-10 are sectional views of a semiconductor structure having an alignment mark at various fabrication stages constructed according to various aspects of the present disclosure in various embodiments.

Referring to FIGS. 1 and 2, the method 100 begins at step 102 by providing a semiconductor substrate 210. The semiconductor substrate 210 includes silicon. Alternatively, the semiconductor substrate 210 includes germanium, silicon germanium or other proper semiconductor materials. The semiconductor substrate 210 also includes various isolation features such as shallow trench isolation (STI) formed in the semiconductor substrate 210 to separate various devices. In one embodiment, the semiconductor substrate 210 includes an alignment region 212 for an alignment mark and a device region 214 for one or more field-effect transistors (FETs) and or other devices. Various STI features 216 are formed in the semiconductor substrate 210. The formation of the STI features 216 includes etching a trench in a substrate and filling the trench by one or more insulator materials such as silicon oxide, silicon nitride, or silicon oxynitride. The filled trench may have a multi-layer structure such as a thermal oxide liner layer with silicon nitride filling the trench. In one embodiment, the STI feature 216 is created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI features. The semiconductor substrate 210 also includes various n-wells and p-wells formed in various active regions.

Still referring to FIGS. 1 and 2, the method 100 proceeds to step 104 by performing a first ion implantation to introduce doping species in the semiconductor substrate 210 in the device region 214 while the alignment region 212 is protected from the first ion implantation using an implant mask layer 217. The first ion implantation 218 includes one or more ion implantations implemented before the formation of gate stacks to form various doped features 219. In one embodiment, the first ion implantation 218 includes a well ion implantation to form a well, such as a n-type well (n-well) or a p-type well (p-well), an ion implantation to adjust threshold voltage, an anti-punch through (APT) ion implantation, or combinations thereof. A patterned photoresist layer or other suitable material layer, such as silicon nitride, is used as an implant mask layer 217. In one embodiment, a patterned photoresist is used as the implant mask layer 217 and is also referred to by 217. The patterned photoresist layer 217 is formed on the substrate to cover the alignment region 212 while the device region 214 is exposed or partially exposed through the openings of the patterned photoresist layer 217. Then an ion implantation process 218 is applied to the device region 214 such that doping species form respective doped feature 219. In one example, when a p-type dopant is introduced to the semiconductor substrate to form one or more p-wells, the implant mask layer 217 is patterned to cover the alignment region and a portion of the device region for an n-well, then a p-type dopant is introduced to the semiconductor substrate 210 by an ion implantation to form one or more p-wells in the device region 214. The patterned photoresist layer 217 is formed using a photolithography process including photoresist coating, soft baking, exposing, post-exposure baking (PEB), developing, and hard baking. The patterned photoresist layer 217 is removed thereafter using a suitable process, such as wet stripping or plasma ashing. Alternatively, if the hard mask layer is present, then the patterned photoresist layer is used to pattern the hard mask layer and the pattern hard mask layer is used as an implant mask.

Figure 3:
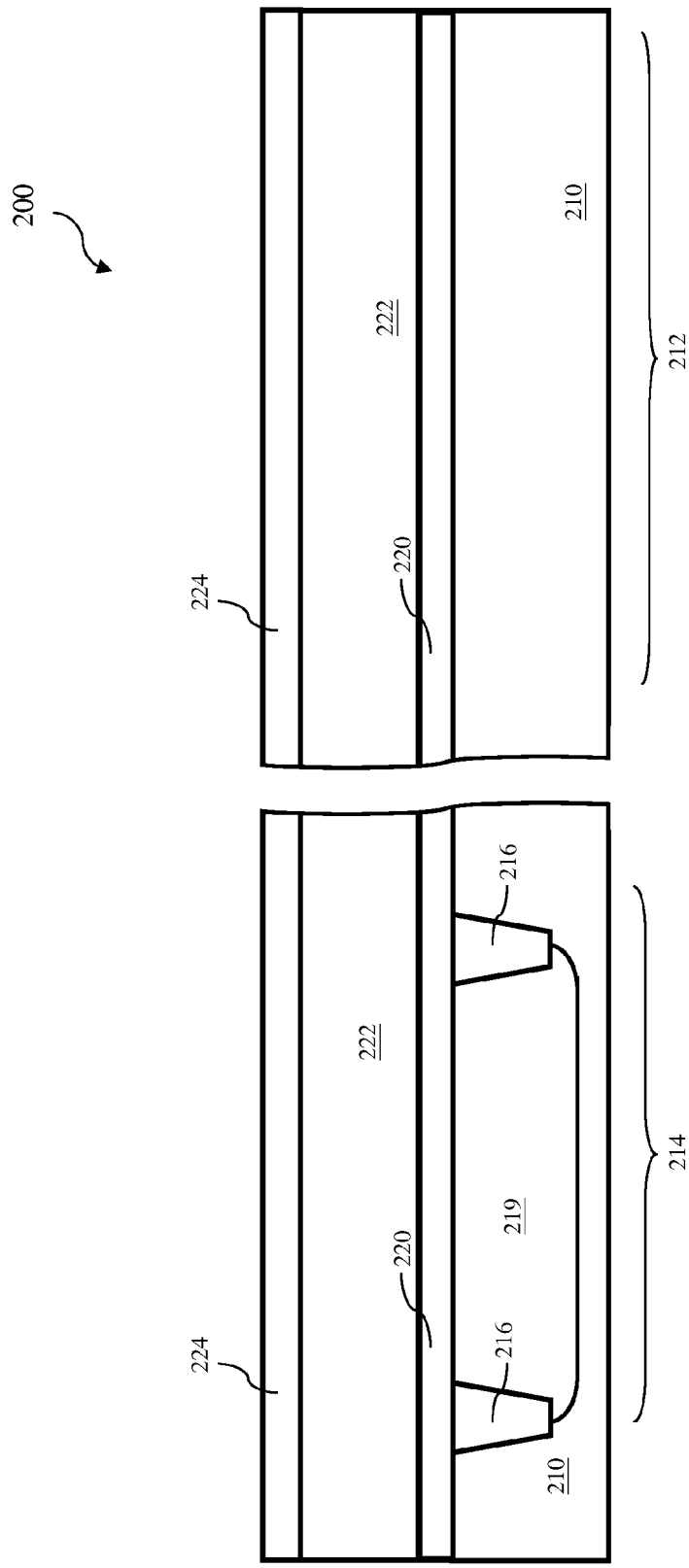
Figure 4:
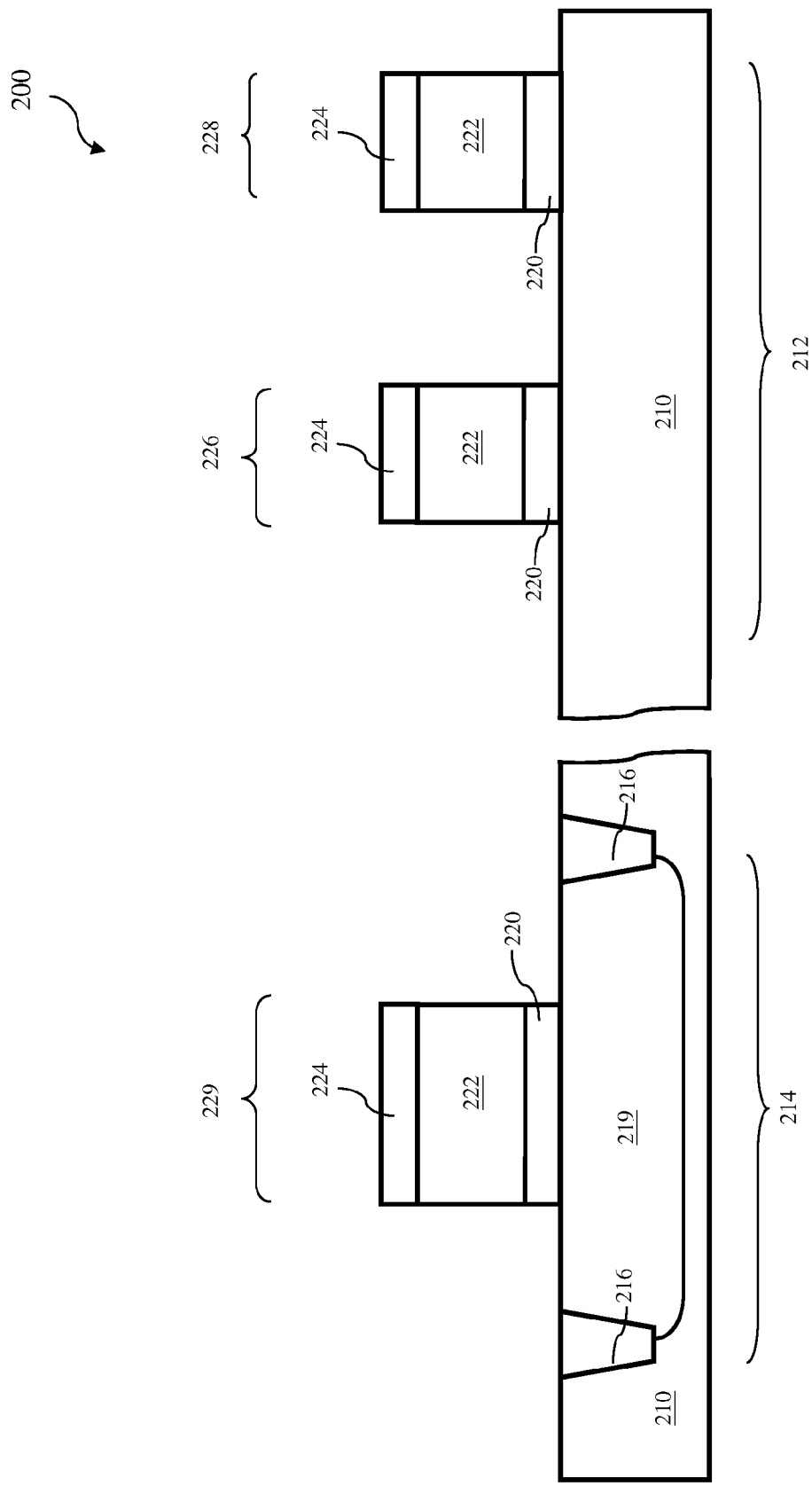

Referring to FIGS. 1, 3 and 4, the method 100 proceeds to step 106 by forming gate stacks in the device region 214 and the alignment region 212. In one embodiment, various gate material layers are formed on the semiconductor substrate 210 as illustrated in FIG. 3. The gate material layers include a dielectric material layer 220 and a silicon layer 222, such as polycrystalline silicon (polysilicon). In the present embodiment, the silicon layer 222 may be non-doped and the dielectric material layer 220 includes a high-k dielectric material layer. The silicon layer 222 alternatively or additionally may include amorphous silicon. The high-k dielectric material layer 220 includes a dielectric material having the dielectric constant higher than that of thermal silicon oxide, which is about 3.9. In one example, the high-k dielectric layer 220 includes hafnium oxide (HfO). In various examples, the high-k dielectric layer 220 includes metal oxide, metal nitride, or combinations thereof. In one example, the high-k dielectric layer 220 includes a thickness ranging between about 10 angstrom and about 100 angstrom.

In various embodiments, the gate material layers include multi-layer dielectric materials, such as an interfacial layer (e.g., silicon oxide) and a high-k dielectric material layer disposed on the interfacial layer. In another embodiment, a hard mask layer 224, such as silicon nitride (SiN) or silicon oxide (SiO2), is further formed on the gate material layers for gate patterning. In various embodiments, the interfacial layer may be formed by chemical oxide technique, thermal oxide procedure, atomic layer deposition (ALD) or chemical vapor deposition (CVD). The high-k dielectric material layer may be formed by CVD, ALD, plasma enhanced CVD (PECVD), or plasma enhanced ALD (PEALD). The non-doped amorphous silicon or polysilicon layer 222 can be formed using CVD with precursor silane (SiH4) or other silicon based precursor. The deposition of the non-doped amorphous silicon layer 222 can be performed at a raised temperature. The hard mask layer (SiN or SiO2) can be formed by CVD or other suitable technique.

Then the gate material layers are patterned to form one or more resistors, such as gate stacks 226 and 228 in the alignment region 212, and one or more gate stacks (or dummy gates), such as a gate stack 229 in the device region 214, as illustrated in FIG. 4. The patterning of the gate material layers can be achieved by a lithography process and/or an etch process. For example, a patterned photoresist layer is formed on the hard mask layer 224 defining various resistor regions and gate regions, using a photolithography process including photoresist coating, soft baking, exposing, post-exposure baking (PEB), developing, and hard baking. Then, the hard mask layer 224 is etched through the openings of the patterned photoresist layer, forming a patterned hard mask. The gate material layers are further etched using the patterned hard mask, forming the various resistors and gate stacks. The patterned photoresist layer is removed thereafter using a suitable process, such as wet stripping or plasma ashing. Alternatively, if the hard mask layer is not present, then the patterned photoresist layer is directly utilized as an etch mask to etch the gate material layers.

The gate stacks 226 and 228 are configured to form an alignment mark. In one embodiment, the gate stacks in the alignment region 212 are configured as a periodic structure to form a grating alignment mark. For example, the grating alignment mark includes two, three, four, or more gate stacks disposed in parallel and periodically. In another embodiment, the alignment mark includes a gate stack designed as a square frame used by box in box or frame in frame alignment technologies. In another embodiment, the gate stack 229 is formed in the device region 214 for a field-effect transistor (FET), such as a metal-oxide-semiconductor (MOS) transistor. The FET can be an n-type field-effect transistor (nFET) or a p-type field-effect transistor (pFET). Alternatively, the gate stack 229 is formed in the device region 214 for an imaging sensor.

Figure 5:
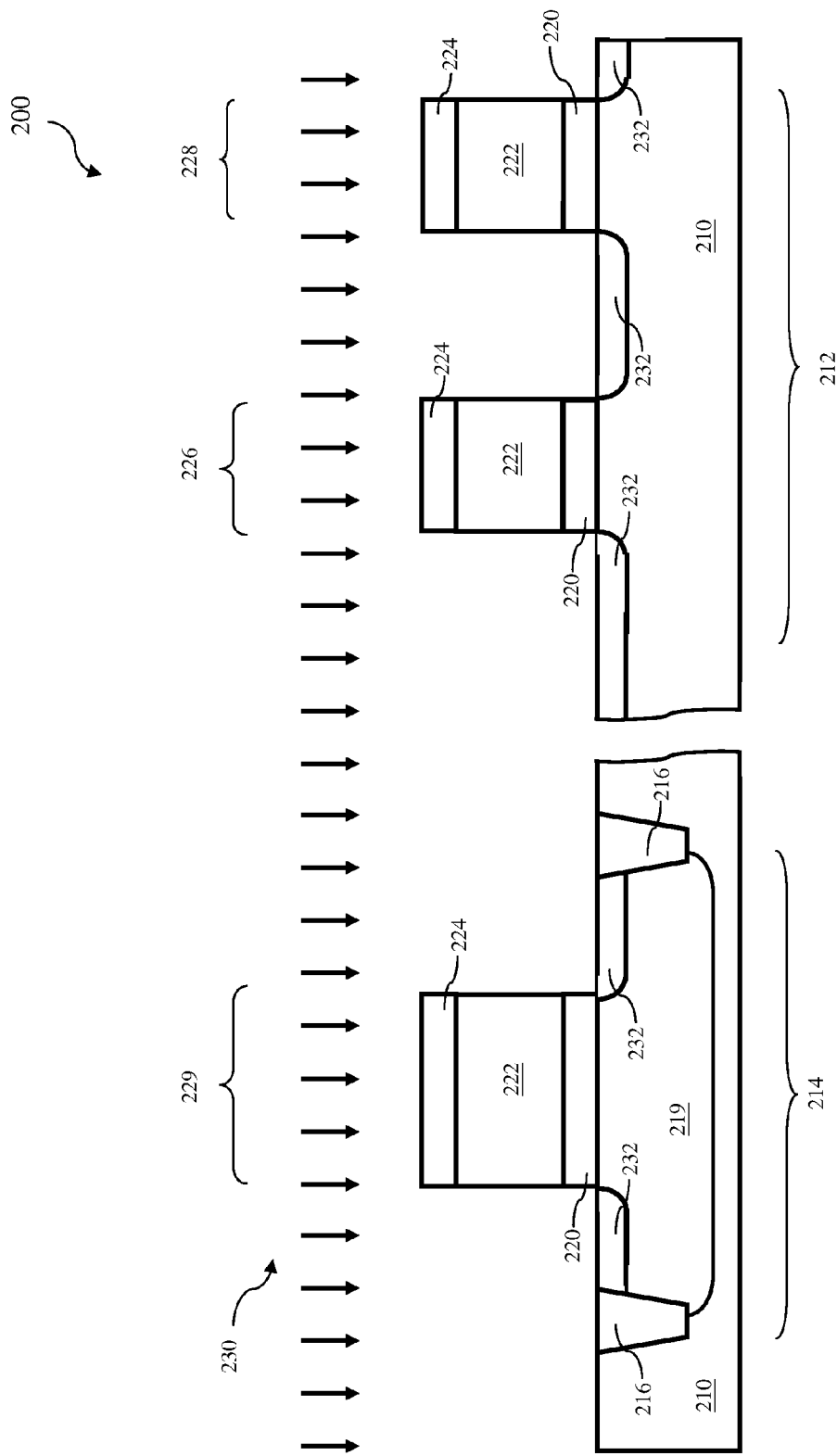
Figure 6:
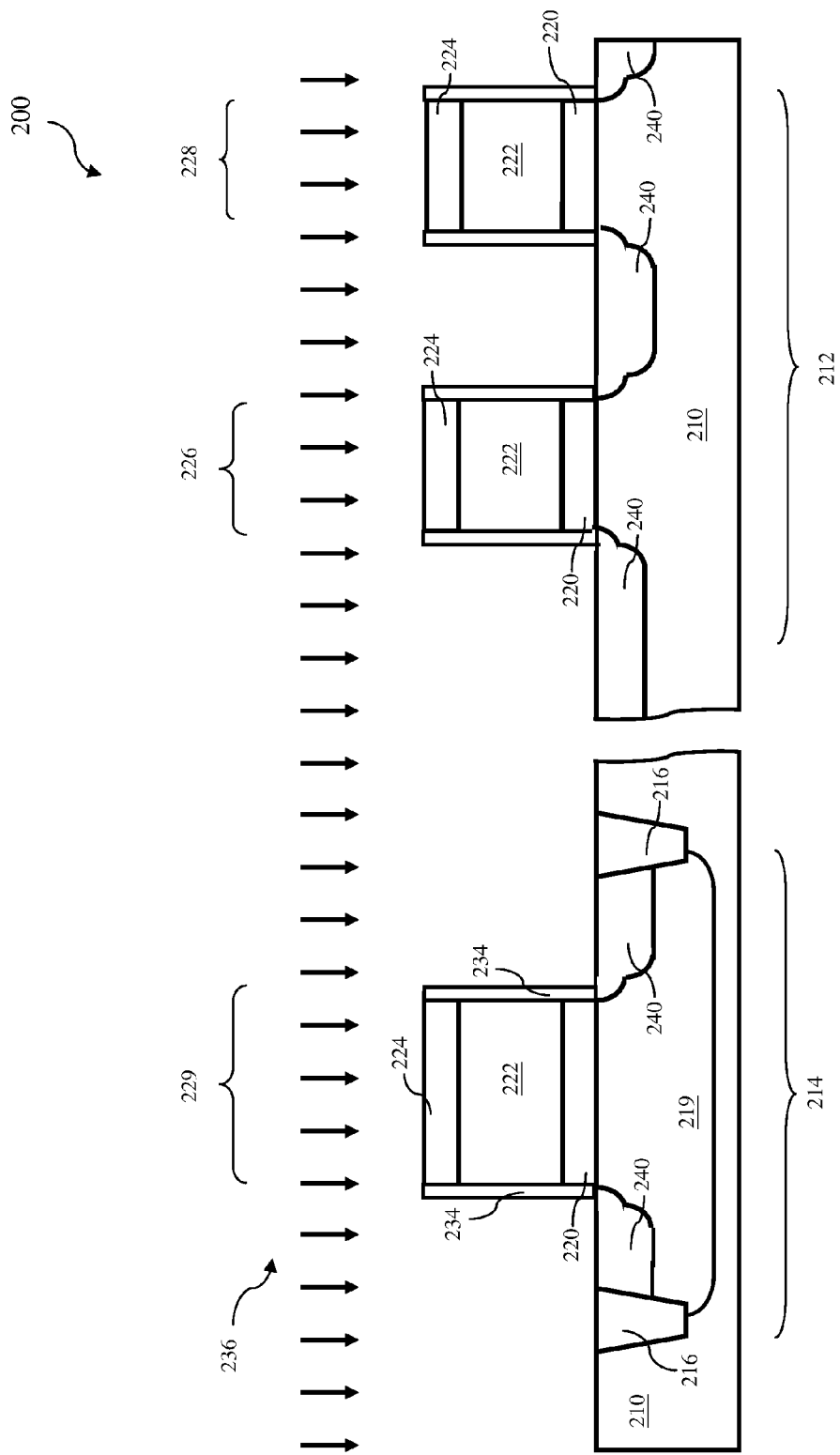

Referring to FIGS. 1, 5 and 6, the method 100 proceeds to step 108 by performing a second ion implantation to introduce doping species into the semiconductor substrate 210 in both device region 214 and the alignment region 212. The second ion implantation is implemented after the formation of the gate stacks (e.g. 226, 228 and 229) at step 106. The second ion implantation may include various implantation steps to form respective doped features. In one embodiment, the second ion implantation includes light doped drain (LDD) ion implantation and heavily doped source and drain (S/D) implantation. Since the second ion implantation is implemented after the formation of the gate stacks at step 106, the corresponding doped features are substantially formed on sides of the gate stacks but not in the channel regions underlying the gate stacks.

In furtherance of the present embodiment, the second ion implantation includes an LDD implantation 230 to form various LDD features 232 in the alignment region 212 and the device region 214, as illustrated in FIG. 5. In one example, an n-type dopant, such as phosphorous or arsenic, is introduced to the semiconductor substrate 210 in both the device region 214 and the alignment region 212 to form n-type LDD features. The doping dose is greater than about $1 \times 10^{14}/cm^2$ to effectively change the refractive index of the semiconductor substrate 210. In one example, the silicon substrate has a change of the refractive index from about 3.89 to about 3.0 after the n-LDD implantation. In the alignment region 212, the difference in the refractive index between the silicon substrate underlying the gate stack and LDD implanted silicon substrate can enhance the contrast of the alignment mark during the alignment operation. In one example, the LDD implantation includes a dose about $10^{15}$ ions/cm$^2$. In another example, the LDD implantation includes an implant energy ranging between about 50 keV and about 100 keV. In one embodiment, the photomask having a LDD implant pattern defines an additional opening for the alignment region. For example, if the alignment region 212 has dimensions of 50 micron×882 micron, the corresponding photomask has an additional opening of 50 micron×882 micron for the alignment region 212 such that the LDD features are formed therein. In another embodiment, a p-type doping species, such as boron (B), may be alternatively used to form p-type LDD features in the alignment region 212.

The second ion implantation may further include heavily doped source and drain (S/D) features formed by another ion implantation step after the LDD. Therefore each gate stack in the device region 214 and the alignment region 212 include both LDD features and S/D features, collectively referred to as source and drain regions. When the device region 214 includes both n-type FETs (nFETs) and p-type FETs (pFETs), the source and drain regions are formed, respectively, for the n-type FETs and the p-type FETs, using proper doping species.

In one embodiment, taking n-type FETs as an example, the LDD features 232 are formed by an ion implantation with a light doping dose. Thereafter, sidewall spacers 234 are formed by dielectric deposition and anisotropic etch, such as plasma etch. Then the heavily doped S/D features are formed by an ion implantation 236 with a heavy doping dose. The various source and drain features of the p-type FETs can be formed in a similar procedure but with opposite doping type.

In one embodiment, during various doping processes to form various n-type source and drain features, the corresponding features including LDD and S/D are also formed in the alignment region 212, as illustrated in FIG. 6. The sidewall spacer 234 can be formed to the gate stacks in the alignment region as well. In one embodiment, a high temperature annealing process may be followed to activate the various doping species in the source and drain features in the device region 214. In another embodiment, the second ion implantation additionally or alternatively includes a pocket ion implantation using the dopant opposite from that of the source and drain, and is formed in the substrate and adjacent the channel region.

Figure 7:
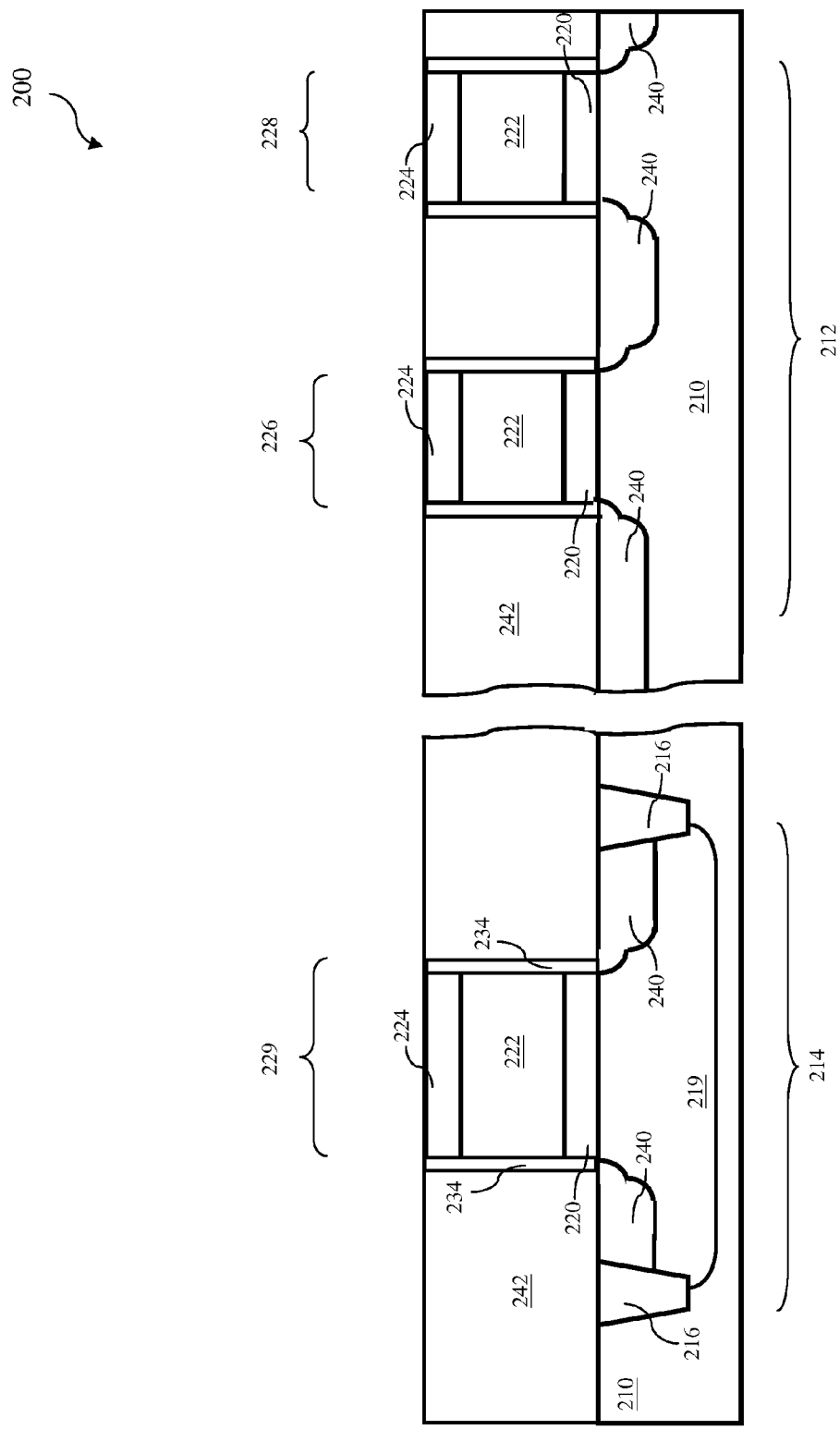
Figure 8:
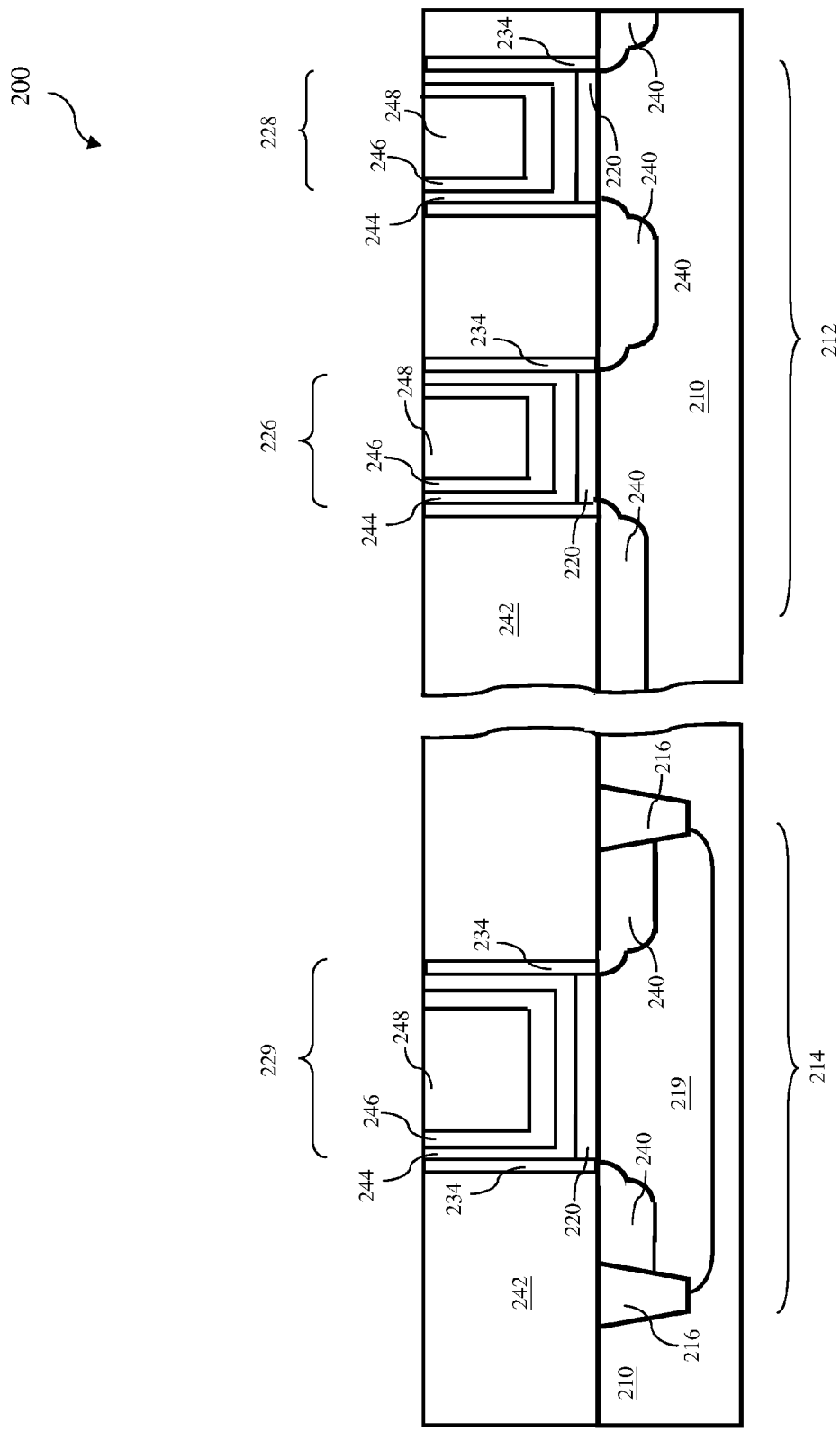

Referring to FIGS. 1, 7 and 8, the method 100 proceeds to step 110 by forming metal gates in the device region 214 and the alignment region 212. In one embodiment, an inter-layer dielectric (ILD) layer 242 is first formed on the semiconductor substrate 210. The ILD layer 242 includes silicon oxide, low k dielectric material, other suitable dielectric materials, or combinations thereof. In another embodiment, the ILD layer 242 includes a buffer silicon oxide layer, a contact etch stop layer (CESL) formed on the buffer silicon oxide layer, and another dielectric material layer disposed on the CESL. The formation of the ILD layer 242 is described below.

The ILD layer 242 is formed by a suitable technique, such as CVD. For example, a high density plasma CVD can be implemented to form the ILD layer 242. In one embodiment, the ILD layer 242 deposits on the semiconductor substrate 210, and fills in the gaps between the gate stacks in the alignment region 212 and the gaps between the gate stacks in the device region 214. In furtherance of the embodiment, the ILD layer 242 is formed on the substrate to a level above the top surface of the gate stacks, such as 226, 228 and 229. A chemical mechanical polishing (CMP) process is then applied to the ILD layer 242 to reduce the thickness of the ILD layer 242 such that the gate stacks are exposed from the top side. The processing conditions and parameters of the CMP process, including slurry chemical and polishing pressure, can be tuned to partially remove and planarize the ILD layer 242. The CMP process may partially or completely remove the hard mask layer 224.

After the formation of the ILD layer 242, an etch process is applied to remove the polysilicon or amorphous silicon of the gate stack 229 within the device region 214 and the alignment region 212. If the hard mask is present and is not removed at the CMP step, the etch process removes the hard mask layer 224 as well. In one embodiment, the etch process includes two steps where the first step is designed to remove the hard mask layer 224 and the second step is designed to remove the silicon in the gate stacks in the device region 214 and the alignment region 212. After the silicon in the gate stacks is removed, trenches are resulted in the ILD layer 242 and are referred to as gate trenches.

In one embodiment, the first etch step to remove the hard mask layer 242 may include phosphoric acid (H3PO4) solution, hydrofluoric acid (HF), or buffered HF if the hard mask layer 224 include silicon nitride. In another embodiment, the etching process used to remove the polysilcion or amorphous silicon of the gate stacks may implement suitable dry etching, wet etching or combinations thereof. In one example, an etching solution including HNO3, H2O and HF, or NH4OH solution, may be used to remove polysilicon (or amorphous silicon). In another example, chlorine (Cl)-based plasma may be used to selectively remove the polysilicon.

After the formation of the gate trenches, one or more metal gate material layers are formed in the gate trenches. In one embodiment, a metal layer 246 of a proper work function (referred to as a work function metal) and a conductive layer 248 are filled in the gate trenches. In one embodiment, the gate trenches in the device region 214 and alignment region 212 are deposited with a work function metal layer 246 and is then filled with the conductive material 248, forming a gate electrode for a nFET. The work function metal 246 for the nFET is referred to as a n-metal. The n-metal includes a metal-based conductive material having a work function compatible to the nFET. For one example, the n-metal has a work function of about or less than about 4.2 eV. In one embodiment, the n-metal includes tantalum (Ta). In another embodiment, the n-metal includes titanium aluminum nitride (TiAlN). In other embodiments, the n-metal includes Ta, TiAl, TiAlN, or combinations thereof. The n-metal may include various metal-based film as a stack for optimized device performance and processing compatibility. The n-metal layer can be formed by a suitable process, such as PVD. The conductive material layer 248 may include aluminum, tungsten or other suitable metal. Then, a CMP process may be applied to remove the excessive work function metal and the conductive material. In one embodiment, the device region 214 includes both nFETs and pFETs. In this embodiment, the metal gates are formed for the nFETs and pFETs, respectively by a proper procedure. For example, after the removal of the silicon from the silicon gate stacks, the metal gates for the nFETs and the alignment mark are formed by a deposition for the n-metal layer, a deposition for the conductive layer, and a CMP process to remove the excessive n-metal layer and the conductive layer while the pFETS are protected by a patterned photoresist layer. Then the metal gates for pFETs are formed by a deposition for the p-metal layer, a deposition for the conductive layer, and a CMP process to remove the excessive p-metal layer and the conductive layer. Alternatively, a p-metal layer is deposited for the pFETs while the nFETs are protected by a patterned photoresist layer. A n-metal layer is deposited for the nFETs and the alignment mark while the pFETs are protected by a patterned photoresist layer. Then a conductive layer is deposited to fill gate trenches for nFETs, pFETs and the alignment mark. A CMP process is applied to the substrate to remove the excessive portion of the n-metal layer, p-metal layer, and conductive layer, forming the metal gates for nFETs, pFETs and alignment mark.

The p-metal includes a metal-based conductive material having a work function compatible to the pFET. For one example, the p-metal has a work function of about or greater than about 5.2 eV. In one embodiment, the p-metal includes titanium nitride (TiN) or tantalum nitride (TaN). In other embodiments, the p-metal include TiN, tungsten nitride (WN), tantalum nitride (TaN), or combinations thereof. The p-metal may include various metal-based film as a stack for optimized device performance and processing compatibility. The p-metal layer can be formed by a suitable process, such as physical vapor deposition (PVD), CVD, ALD, PECVD, PEALD or spin-on metal. The conductive material thereafter substantially fills in the gate trench. The conductive material includes aluminum or tungsten according to various embodiments. The method to form the conductive material may include PVD, CVD, ALD, PECVD, PEALD or spin-on metal. Then, a CMP process may be applied to remove the excessive work function metal and the conductive material, forming the metal gate. Although the semiconductor structure 200 only illustrates one field-effect transistor in the device region 214, a plurality of FETs and other devices can be formed in the device region. The present process to form the metal gates may have other alternative embodiment. For example, the metal gate for nFETs and pFETs may be formed by other sequence or other procedure.

In one embodiment, the metal gates may include a step to deposit a high-k dielectric material layer 244 the silicon oxide layer 220 in the gate trenches, and then a work function metal layer and a conductive layer are formed on the high-k dielectric material layer 244. This process is referred to as high-k last process. Alternatively, in the high-k last process, the silicon oxide layer 220 is first removed before forming the work function metal layer and conductive material layer. In this case, a new interfacial layer, such as silicon oxide, is first formed on the semiconductor substrate 210, then the high-k dielectric material layer, work function metal layer and conductive material layer are formed in the corresponding gate trenches.

As described above, the alignment mark in the alignment region 212 including the gate stacks 226 and 228 in the alignment region 212 are replaced by a metal gate. Particularly, the polysilicon in the gate stacks 226 and 228 are replaced to form metal gates similar to the metal gate for the n-FETs in the device region 214 and formed in the same process to form the metal gates for the nFETs. Therefore, the gate stacks in the alignment region 212 include the n-metal layer and the conductive material layer. In another example, the polysilicon gate stacks 226 and 228 may be replaced to form metal gates similar to the metal gates for the p-FETs in the device region 214 and formed by the same process to form the metal gates for the pFETs. In this case, the gate stacks in the alignment region 212 include the p-metal layer and the conductive material layer.

Figure 9:
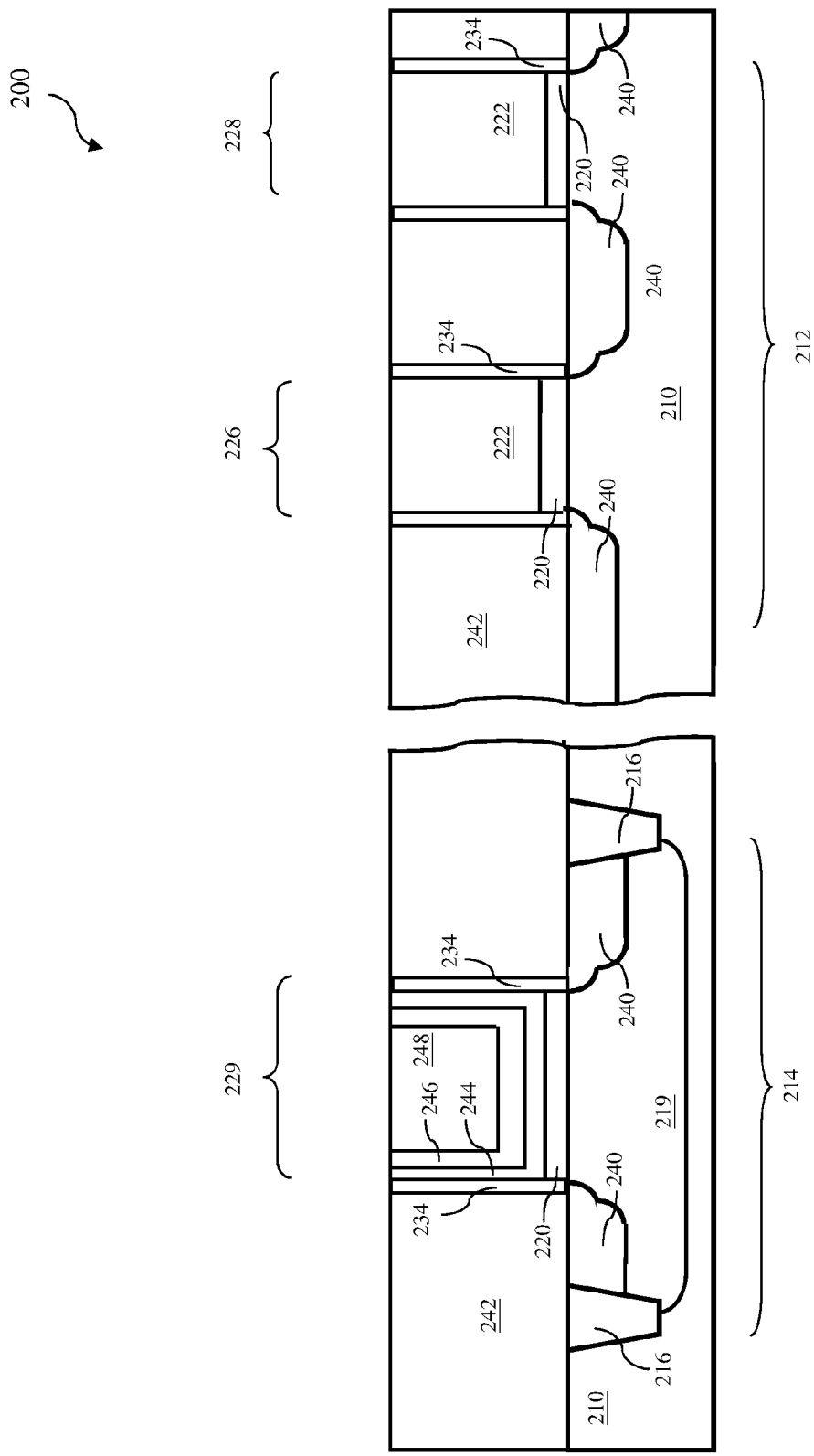

In another embodiment, the gate stacks for the alignment mark in the alignment region 212 remain as polysilicon gate stacks without replacement. In this case, the alignment region 212 is covered by a patterned mask layer such as a patterned photoresist layer or a patterned hard mask layer during the gate replacement to form metal gates for devices in the device region 214, as illustrated in FIG. 9.

Figure 10:
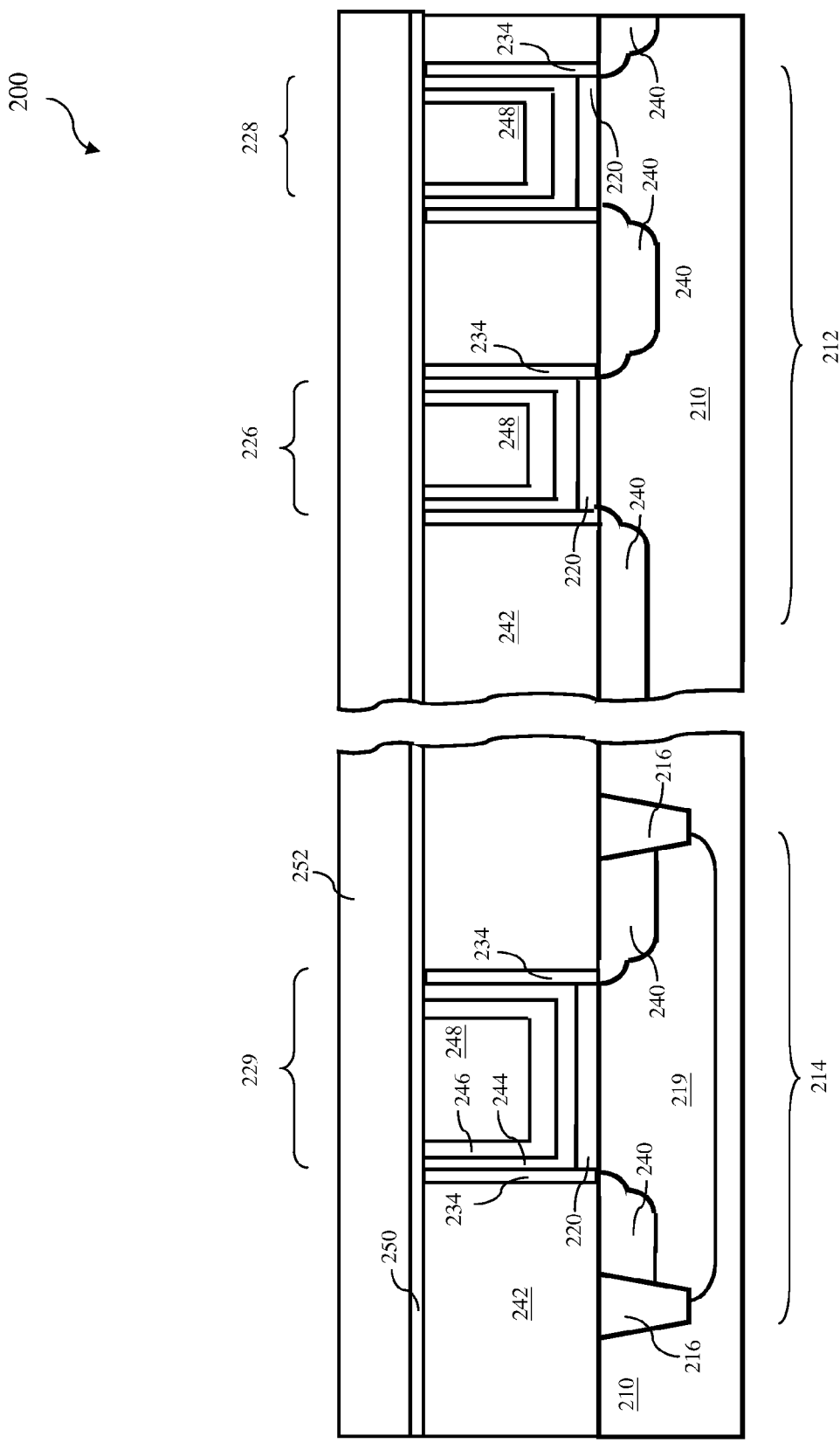
Figure 11:
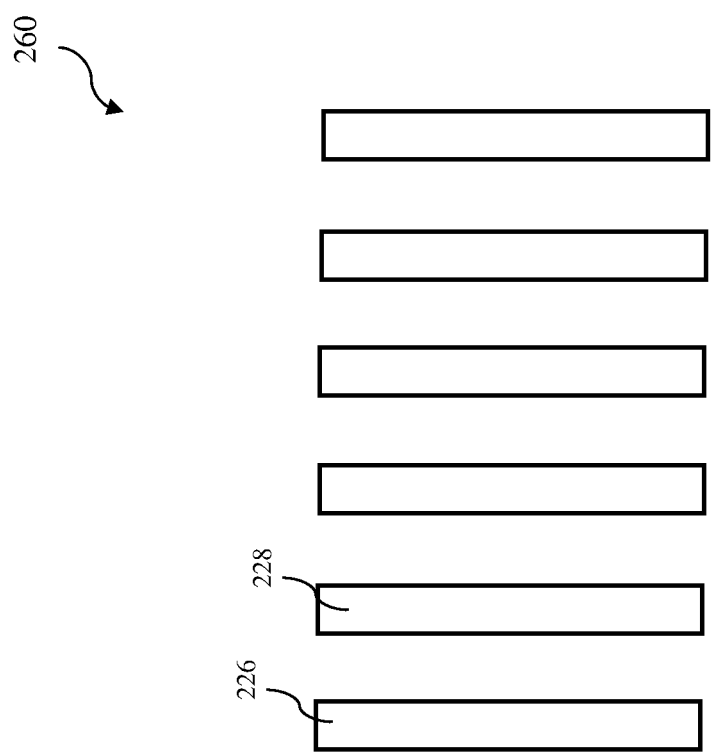
FIG. 11 is a top view of an alignment mark of the semiconductor structure of FIG. 8 constructed according to various aspects of the present disclosure.

Referring to FIG. 10, the method 100 may proceed to step 112 by forming contact holes to electrical interconnection. In one embodiment, a contact etch stop layer (CESL) 250 is formed on the ILD layer 242 and another ILD layer 252 is formed on the CESL 250. Then a photoresist layer (not shown) is coated on the semiconductor structure 200 in a lithography process, a soft baking may be applied to the coated photoresist layer. Then a photomask (or mask) having a contact pattern is placed on the lithography exposure apparatus and the semiconductor structure 200 is secured on a wafer stage of the lithography exposure apparatus. Then the photomask is aligned to the semiconductor structure 200 before exposing the coated photoresist layer. The alignment operation uses the alignment mark including the gate stacks 226 and 228 in the alignment region 212. The alignment mark is further described with additional reference to FIG. 11. FIG. 11 is a top view of an alignment mark of the semiconductor structure of FIG. 8 constructed according to various aspects of the present disclosure. In FIG. 11, an alignment mark is labeled with numeral 260. The alignment mark 260 is formed in the alignment region 212 of FIG. 8. The alignment mark 260 includes gate stacks 226 and 228, and may include additional gate stacks configured as a grating alignment mark. In one example, the gate stacks include a width of about 1.6 micron and a pacing of about 1.6 micron.

In yet another embodiment, the alignment mark 260 may include a second set of gate stacks configured to a similar grating structure and used for alignment in a perpendicular direction. In one embodiment, the second set of gate stacks may be oriented in a direction perpendicular to the direction of the gate stacks 226 and 228. In another embodiment, the second set of gate stacks may be oriented in the same direction but with a different grating pitch.

As the substrate 210 is doped by one or more doping processes, such as LDD doping, heavily doped S/D, and/or pocket implant, the refractive index of the substrate 210 is changed, the alignment signal is substantially increased. A wafer quality (WQ) is defined to quantitatively describe the alignment signal quality. WQ is percentage of actual signal strength with reference to signal generated by fiducial mark. In one embodiment, WQ is defined as $$WQ = (SS_{align}/Gain_{align})/(SS_{ref}/Gain_{ref})$$

Where $SS_{align}$ is the signal strength of the alignment signal from the alignment mark, $Gain_{align}$ is the signal strength of the gain of the alignment signal, $SS_{ref}$ is the signal strength of the reference signal from the fiducial mark, and $Gain_{ref}$ is the gain of the reference signal.

Usually, WQ should be more than 1% in order to obtain a reliable alignment results. In one example, the existing structure of the alignment provides a WQ less than 1%, such as 0.3%. In the disclosed structure of the alignment mark, the WQ is increased to be greater than 1%. In another example, for the alignment light of wavelength of about 633 nm, the WQ is greater than 3. In yet example, for the alignment light of wavelength of about 532 nm, the WQ is greater than 8.

In the alignment operation, the semiconductor structure 200 (or wafer) is positioned by the wafer stage to align between the photomask and the wafer by utilizing the disclosed alignment structure. After the alignment, the coated photoresist layer is exposed. Other steps in the lithography process, such as post exposure baking (PEB), developing and hard baking, may follow to form the patterned photoresist layer with the contact pattern aligned with the other features (gate stacks, source and drain features) in the semiconductor structure. An etch process is applied to the ILD layers 242 and 252 and form contact holes in the ILD layers. Other processing steps may be subsequently implemented. In another embodiment, a conductive material, such as tungsten, is filled in the contact holes to form contacts. In one embodiment, a silicide is first formed on the semiconductor substrate 210 to reduce the contact resistance. The conductive material is thereafter filled in the contact holes to form contacts. A CMP process may subsequently implemented to remove the excessive conductive layer.

Although not shown, other alternative features and processing steps may be present. In one embodiment, the device region 214 includes other devices, such as a static random access memory (SRAM) cell. In one example, a SRAM cell includes nFET and pFET configured as a cross coupled two inventers, and may further includes other FET as pass gates. In another embodiment, the FET may be configured and designed for other applications, such as imaging sensors. In another embodiment, the semiconductor substrate 200 includes more than one alignment regions. For example, each field may include an alignment mark. During the exposing process, each field is aligned with the photoresist using the alignment mark in the corresponding field. The field is exposed by the lithography light. The same process is repeated to the other fields of the wafer. In another embodiment, two or more alignment marks are formed in a different location of the wafer, the alignment is achieved according to an average among the alignment inputs various alignment marks. Then, the whole wafer is step-scanned or step-exposed. In another embodiment, the nFETs in the device region 214 include p-wells and pFETs in the device region 214 include n-wells. In another embodiment, the device region 214 includes p-cell and n-cell ion implantation features for SRAM devices. The p-cell and n-cell ion implantation features are similar to the p-well and n-wells but have different doping doses and concentrations. In another embodiment, the alignment mark is formed on semiconductor substrate 210. For example, the alignment mark includes a plurality STI features formed in the alignment region and configured as a grating similar to the alignment mark 260 of FIG. 11 in configuration.

In another embodiment, the p-metal layer and n-metal layer are formed in different order such that n-metal layer is formed first and the p-metal layer is formed thereafter. In another embodiment, a pFET has a strained structure for enhanced carrier mobility and improved device performance. In furtherance of the embodiment, silicon germanium (SiGe) is formed in the source and drain regions of the pFET to achieve a proper stress effect. In one example of forming such a strained pFET, the silicon substrate within the source and drain regions of the pFET are recessed by one or more etching step. Then SiGe is epi grown in the recessed regions and heavy doped source and drain are formed in the epi grown SiGe features. In another example, a dummy spacer is formed after the formation of the LDD features. The dummy spacer is removed after the formation of the SiGe features. Then a main spacer is formed on the sidewalls of the associated gate stack, with a different thickness such that the heavy doped source and drain have an offset from the SiGe features. For instance, the main spacer is thicker than the dummy spacer such that the heavy doped source and drain are formed in the SiGe features.

In another embodiment, a nFET has a strained structure for enhanced carrier mobility and improved device performance. In furtherance of the embodiment, silicon carbide (SiC) is formed in the source and drain regions of the nFET to achieve a proper stress effect. The strained nFET can be formed similarly as the strained pFET is formed. In another embodiment, the n-metal and p-metal layers each may include other proper metal or metal alloy. In another embodiment, the n-metal and p-metal layers each have a multi-layer structure to optimize work function and reduce threshold voltage.

Other processing steps may be implemented before, during and/or after the formation of the gate stacks (e.g. 226 and 228). For example, the multilayer interconnection are further formed after the step 112. The multilayer interconnection includes vertical interconnects, such as conventional vias and horizontal interconnects, such as metal lines. The various interconnection features may implement various conductive materials including copper, tungsten and silicide. In one example, a damascene process is used to form a copper related multilayer interconnection structure.

In one example, the high-k dielectric material layer can be formed by other suitable process such as metal organic chemical vapor deposition (MOCVD), or molecular beam epitaxy (MBE). In one embodiment, the high-k dielectric material includes HfO2. In another embodiment, the high-k dielectric material includes Al2O3. Alternatively, the high-k dielectric material layer includes metal nitrides, metal silicates or other metal oxides. In another example, an interfacial layer, such as silicon oxide, is formed on the semiconductor substrate by a thermal oxidation, ALD, UV-Ozone Oxidation or other suitable method. In another example, a capping layer may be interpose between the high-k dielectric material layer and the n-metal (or p-metal) layer.

In a further embodiment as noted above, a high-k dielectric material layer can be formed in the gate stacks after the removal of the polysilicon layer. For example, the dielectric material layer 220 formed at step 106 of FIG. 1 includes only silicon oxide layer as a dummy oxide layer, then the high-k metal gate (HKMG) stack is formed by a high-k last procedure where both a high-k dielectric material layer and metal layer(s) are formed to fill the gate trench. Thus, formed HKMG stack is also referred to as a complete replacement gate.

In another example, the formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, and using chemical mechanical planarization (CMP) to etch back.

The various patterning process may include forming a patterned photoresist layer by a photolithography process. An exemplary photolithography process may include processing steps of photoresist spin-on coating, soft baking, mask aligning, exposing, post-exposure baking, developing photoresist and hard baking. The photolithography exposing process may also be implemented or replaced by other proper methods such as maskless photolithography, electron-beam writing, ion-beam writing, thermal lithography, and molecular imprint.

The present disclosure is not limited to applications in which the semiconductor structure includes a FET (e.g. MOS transistor) or SRAM, and may be extended to other integrated circuit having a metal gate stack and the alignment mark. For example, the semiconductor structures may include a dynamic random access memory (DRAM) cell, an imaging sensor, a capacitor and/or other microelectronic devices (collectively referred to herein as microelectronic devices). In another embodiment, the semiconductor structure includes FinFET transistors. Of course, aspects of the present disclosure are also applicable and/or readily adaptable to other type of transistor, including single-gate transistors, double-gate transistors and other multiple-gate transistors, and may be employed in many different applications, including sensor cells, memory cells, logic cells, and others.

It is understood that various different combinations of the above-listed embodiments and steps can be used in various sequences or in parallel, and there is no particular step that is critical or required. Furthermore, features illustrated and discussed above with respect to some embodiments can be combined with features illustrated and discussed above with respect to other embodiments. Accordingly, all such modifications are intended to be included within the scope of this invention.

What is claimed is:

1. A semiconductor structure, comprising:
a semiconductor substrate having a device region and an alignment region;
a plurality of gate stacks formed on the semiconductor substrate in the alignment region and configured as an alignment mark, wherein the plurality of gate stacks include a first gate stack and a second gate stack;
doped features formed in the semiconductor substrate and disposed on sides of each of the plurality of gate stacks, wherein the doped features include a source/drain feature continuously extending within the semiconductor substrate from an edge of the first gate stack to an edge of the second gate stack, wherein the doped features have a refractive index of about 3; and
channel regions underlying the plurality of gate stacks and free of well dopant, the well dopant being located in the device region.

2. The semiconductor structure of claim 1, wherein the plurality of gate stacks each includes a high-k dielectric material layer and a metal layer disposed on the high-k dielectric material layer.

3. The semiconductor structure of claim 1, wherein the doped features include light doped drain (LDD) features.

4. The semiconductor structure of claim 1, wherein the doped features include heavily doped source/drain (S/D) features.

5. The semiconductor structure of claim 1, wherein the doped features include pocket implantation features.

6. The semiconductor structure of claim 1, wherein the plurality of gate stacks are configured as a grating structure.

7. The semiconductor structure of claim 1, further comprising a field-effect device (FET) in the device region, the FET including:
a metal gate formed on the semiconductor substrate;
source and drain regions formed in the semiconductor substrate and disposed on sides of the metal gate; and
a channel doping feature formed in a FET channel region and underlying the metal gate.

8. The semiconductor structure of claim 7, wherein the channel doped feature in the FET channel region includes channel doped species for adjusting threshold voltage and the channel region in the alignment region is free of channel doping species.

9. The semiconductor structure of claim 1, wherein the semiconductor substrate includes silicon.

10. A semiconductor structure having an alignment mark, comprising:
a semiconductor substrate having a device region and an alignment region;
a field-effect device formed within the device region, including:
a first gate stack formed on the semiconductor substrate;
a first source and drain regions formed in the semiconductor substrate and disposed on both sides of the first gate stack; and
a first channel region having a channel doped feature formed in the semiconductor substrate and underlying the gate stack; and
an alignment mark formed within the alignment region, including:
a second gate stack and a third gate stack formed on the semiconductor substrate;
a second source and drain region formed in the semiconductor substrate and continuously extending within the semiconductor substrate from an edge of the second gate stack to an edge of the third gate stack; and
a second channel region free of channel doped feature in the semiconductor substrate and underlying the second gate stack, and
wherein the semiconductor substrate includes silicon and the second source and drain regions have a refractive index of about 3.

11. The semiconductor structure of claim 10, wherein
the first gate stack includes a high-k dielectric material layer and a metal layer disposed on the high-k dielectric material layer; and
the second gate stack includes the high-k dielectric material layer and the metal layer disposed on the high-k dielectric material layer.

12. The semiconductor structure of claim 10, wherein
the first gate stack includes a high-k dielectric material layer and a metal layer disposed on the high-k dielectric material layer; and
the second gate stack includes a silicon oxide layer and a polysilicon layer disposed on the silicon oxide layer.

13. The semiconductor structure of claim 10, wherein the first and second source and drain regions include:
light doped drain (LDD) features; and
heavily doped source/drain (S/D) features.

14. The semiconductor structure of claim 10, wherein the channel doped feature includes doped species incorporated for adjusting threshold voltage.

15. The semiconductor structure of claim 10, wherein the second gate stack includes a high-k dielectric material layer and a metal layer disposed directly on the high-k dielectric material layer such that the metal layer physically contacts the high-k dielectric material layer.

16. A method comprising:
providing a semiconductor substrate having a device region and an alignment region;
performing a first ion implantation to the semiconductor substrate within the device region while the alignment region is covered by an implantation mask layer;
thereafter forming a first polysilicon gate stack in a device region and a second polysilicon gate stack in an alignment region;
thereafter performing a second ion implantation to the semiconductor substrate within the device region and within the alignment region, wherein performing the second ion implantation modifies a refractive index of the semiconductor substrate and increases a wafer quality of an alignment signal from the alignment region to be greater than 1%; and
replacing the first and second polysilicon gate stacks with metal gate stacks.

17. The method of claim 16, further comprising:
forming an interlayer dielectric (ILD) material layer on the semiconductor substrate;
coating a photoresist layer on the ILD material layer;
aligning a mask to the semiconductor substrate according to an alignment signal from the alignment region; and
exposing the photoresist layer using the mask having a contact pattern.

18. The method of claim 16, wherein the first ion implantation includes ion implantations selected from the group consisting of well implantation, threshold voltage implant, and a combination thereof.

19. The method of claim 16, wherein the second ion implantation includes n-type light-doped drain (n-LDD) doping process with doping dose greater than about $10^{14}$ ions/cm$^2$.

20. The method of claim 16, wherein performing the second ion implantation forms a doped region in the semiconductor substrate having a refractive index of about 3.

* * * * *